(12) United States Patent
Lee et al.

(10) Patent No.: US 10,224,445 B2
(45) Date of Patent: Mar. 5, 2019

(54) BACK SHEET, METHOD OF MANUFACTURING THE SAME, SOLAR CELL MODULE USING THE SAME AND METHOD OF MANUFACTURING SOLAR CELL

(71) Applicants: S-ENERGY CO., LTD., Seongnam-si, Gyeonggi-do (KR); SKC CO., LTD., Suwon-si, Gyeonggi-do (KR)

(72) Inventors: Sunki Lee, Suwon-si (KR); Ki Nam Byun, Hwaseong-si (KR); Youngduck Kim, Gwacheon-si (KR); Koo Lee, Daejeon (KR); Byeong Man Kim, Daejeon (KR); Won Hee Lee, Daejeon (KR)

(73) Assignees: S-ENERGY CO., LTD., Seongnam-si, Gyeonggi-do (KR); SKC CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/339,869

(22) Filed: Oct. 31, 2016

(65) Prior Publication Data

US 2017/0125615 A1    May 4, 2017

(30) Foreign Application Priority Data

Nov. 2, 2015 (KR) .......... 10-2015-0153273
Nov. 18, 2015 (KR) .......... 10-2015-0161695

(51) Int. Cl.
| | |
|---|---|
| *B32B 7/04* | (2006.01) |
| *B32B 7/12* | (2006.01) |
| *B32B 15/08* | (2006.01) |
| *B32B 15/09* | (2006.01) |
| *B32B 15/095* | (2006.01) |

(Continued)

(52) U.S. Cl.
CPC ........ *H01L 31/0481* (2013.01); *H01L 31/049* (2014.12); *H01L 31/056* (2014.12);
(Continued)

(58) Field of Classification Search
None
See application file for complete search history.

(56) References Cited

U.S. PATENT DOCUMENTS 3,823,202 A * 7/1974 Buzbee ............... C08F 283/01
                                                  523/500
3,877,787 A * 4/1975 Buzbee ............ B29D 11/00615
                                                  359/539

(Continued)

FOREIGN PATENT DOCUMENTS

EP    0 484 956 A  *  5/1992
JP    03-015543 A  *  1/1991
(Continued)

OTHER PUBLICATIONS

Schimtz, Peter et al., "Films." Ullmann's Encyclopedia of Industrial Chemistry, 5th Ed., vol. A11 (1988), pp. 85-110. (Year: 1988).*

(Continued)

*Primary Examiner* — Vivian Chen
(74) *Attorney, Agent, or Firm* — Revolution IP, PLLC

(57) ABSTRACT

Provided is a solar cell module comprising a back sheet including a reflective film including a deposited reflective layer including metal and having 2 or higher optical density (OD), and an UV blocking layer positioned below the reflective film and having 5% or lower transmittance of light at 380 nm wavelength.

6 Claims, 4 Drawing Sheets

(51) Int. Cl.
| | |
|---|---|
| B32B 27/08 | (2006.01) |
| B32B 27/36 | (2006.01) |
| B32B 27/40 | (2006.01) |
| C08L 67/00 | (2006.01) |
| C08L 75/04 | (2006.01) |
| C08L 75/06 | (2006.01) |
| C09J 167/00 | (2006.01) |
| C09J 175/04 | (2006.01) |
| C09J 175/06 | (2006.01) |
| C09D 167/00 | (2006.01) |
| C09D 175/04 | (2006.01) |
| C09D 175/06 | (2006.01) |
| C08G 18/32 | (2006.01) |
| C08G 18/34 | (2006.01) |
| C08G 18/40 | (2006.01) |
| C08G 18/42 | (2006.01) |
| H01L 31/0232 | (2014.01) |
| H01L 31/049 | (2014.01) |
| H01L 31/048 | (2014.01) |
| H02S 40/22 | (2014.01) |
| H01L 31/056 | (2014.01) |
| C09J 167/02 | (2006.01) |
| C08L 67/02 | (2006.01) |
| C09D 167/02 | (2006.01) |

(52) U.S. Cl.
CPC ........... H02S 40/22 (2014.12); *B32B 7/04* (2013.01); *B32B 7/12* (2013.01); *B32B 15/08* (2013.01); *B32B 15/09* (2013.01); *B32B 15/095* (2013.01); *B32B 27/08* (2013.01); *B32B 27/36* (2013.01); *B32B 27/40* (2013.01); *B32B 2250/03* (2013.01); *B32B 2250/04* (2013.01); *B32B 2255/205* (2013.01); *B32B 2255/26* (2013.01); *B32B 2255/28* (2013.01); *B32B 2307/302* (2013.01); *B32B 2307/416* (2013.01); *B32B 2307/518* (2013.01); *B32B 2307/71* (2013.01); *B32B 2307/7242* (2013.01); *B32B 2307/7246* (2013.01); *B32B 2311/00* (2013.01); *B32B 2367/00* (2013.01); *B32B 2375/00* (2013.01); *B32B 2457/12* (2013.01); *C08G 18/32* (2013.01); *C08G 18/3203* (2013.01); *C08G 18/3206* (2013.01); *C08G 18/34* (2013.01); *C08G 18/341* (2013.01); *C08G 18/40* (2013.01); *C08G 18/42* (2013.01); *C08L 67/00* (2013.01); *C08L 67/02* (2013.01); *C08L 75/04* (2013.01); *C08L 75/06* (2013.01); *C09D 167/00* (2013.01); *C09D 167/02* (2013.01); *C09D 175/04* (2013.01); *C09D 175/06* (2013.01); *C09J 167/00* (2013.01); *C09J 167/02* (2013.01); *C09J 175/04* (2013.01); *C09J 175/06* (2013.01); *H01L 31/0232* (2013.01); *H01L 31/02327* (2013.01); *H01L 31/048* (2013.01); *Y02E 10/52* (2013.01); *Y10T 428/31551* (2015.04); *Y10T 428/31565* (2015.04); *Y10T 428/31605* (2015.04); *Y10T 428/31681* (2015.04); *Y10T 428/31786* (2015.04)

(56) References Cited

U.S. PATENT DOCUMENTS

| | | | | |
|---|---|---|---|---|
| 4,503,189 A | * | 3/1985 | Igarashi | C08G 18/10 525/104 |
| 4,612,115 A | * | 9/1986 | Titoff | B01J 8/20 210/189 |
| 5,379,180 A | * | 1/1995 | Kinoshita | H01G 4/18 361/304 |
| 5,540,974 A | * | 7/1996 | Hoseki | H01G 4/20 361/323 |
| 5,569,707 A | * | 10/1996 | Blum | C08G 18/0819 524/539 |
| 5,581,435 A | * | 12/1996 | Kinoshita | H01G 4/18 361/301.4 |
| 5,645,938 A | * | 7/1997 | Crandall | C08G 18/4216 428/143 |
| 5,710,209 A | * | 1/1998 | Blum | C08G 18/0819 524/538 |
| 5,738,926 A | * | 4/1998 | Kinoshita | H01G 4/015 428/141 |
| 5,959,775 A | * | 9/1999 | Joseph | C08G 18/10 359/536 |
| 6,194,061 B1 | * | 2/2001 | Satoh | B32B 27/08 428/341 |
| 6,287,667 B1 | * | 9/2001 | Kinoshita | H01G 4/18 264/288.4 |
| 6,458,467 B1 | * | 10/2002 | Mizuno | C09J 7/0246 428/141 |
| 6,532,119 B1 | * | 3/2003 | Martinez, Sr. | G02B 5/0866 359/883 |
| 2003/0137739 A1 | * | 7/2003 | Yoshida | G02B 5/0221 359/599 |
| 2004/0234771 A1 | * | 11/2004 | Meyer | B29C 51/002 428/412 |
| 2006/0217497 A1 | * | 9/2006 | Kitada | C08G 18/0823 525/453 |
| 2008/0247175 A1 | * | 10/2008 | Yoon | B32B 3/26 362/341 |
| 2009/0078314 A1 | * | 3/2009 | Temchenko | B32B 17/10788 136/256 |
| 2009/0255571 A1 | * | 10/2009 | Xia | B29C 70/70 136/251 |
| 2010/0043871 A1 | * | 2/2010 | Xia | H01L 31/049 136/251 |
| 2010/0068531 A1 | * | 3/2010 | Gu | H05K 9/0084 428/425.8 |
| 2011/0100415 A1 | * | 5/2011 | Osamura | B32B 25/08 136/244 |
| 2011/0104482 A1 | * | 5/2011 | Yasui | B32B 7/12 428/343 |
| 2012/0082785 A1 | * | 4/2012 | Kim | C08G 63/181 427/209 |
| 2012/0177932 A1 | * | 7/2012 | Masuda | B32B 27/36 428/423.7 |
| 2012/0183792 A1 | * | 7/2012 | Mizuno | H01L 31/02167 428/458 |
| 2012/0314450 A1 | * | 12/2012 | Sakaguchi | G02B 5/0226 362/602 |
| 2013/0065063 A1 | * | 3/2013 | Masuda | B32B 27/20 428/423.7 |
| 2013/0112272 A1 | * | 5/2013 | Ackermann | B32B 27/08 136/259 |
| 2013/0122285 A1 | * | 5/2013 | Kawasaki | C09D 167/00 428/336 |
| 2013/0130015 A1 | * | 5/2013 | Cosentino | B32B 27/205 428/315.9 |
| 2014/0083482 A1 | * | 3/2014 | Hebrink | H01L 31/054 136/246 |
| 2014/0130851 A1 | * | 5/2014 | Osamura | B32B 25/08 136/251 |
| 2014/0213703 A1 | * | 7/2014 | Amasaki | C07D 409/14 524/100 |

FOREIGN PATENT DOCUMENTS

| | | | | |
|---|---|---|---|---|
| JP | 04-001039 A | * | 1/1992 | |
| JP | 04-001040 A | * | 1/1992 | |
| JP | 04-176858 A | * | 6/1992 | |
| JP | 09-327897 A | * | 12/1997 | |
| JP | 10-006461 A | * | 1/1998 | |
| JP | 2002-234931 A | * | 8/2002 | |
| JP | 2005-089511 A | * | 4/2005 | |

(56) References Cited

FOREIGN PATENT DOCUMENTS

| | | | | |
|---|---|---|---|---|
| JP | 2006-319250 A | * | 11/2006 | |
| JP | 2011-156848 A | * | 8/2011 | |
| JP | 2015-003950 A | * | 2/2015 | |
| KR | 10-0256550 B | * | 5/2000 | |
| WO | WO 2008/039658 A | * | 4/2008 | |

OTHER PUBLICATIONS

Carraher Jr., Charles. Polymer Chemistry, 6th Ed., (2003) (excerpt of section 3.14). (Year: 2003).*

"Technology of Vacuum Metallized Plastics Packaging" (http://www.plasticstrends.net/index.php/last-months-mainmenu-28/21-technology-of-vacuum-metallized-plastics-packaging) (Feb. 13, 2006). (Year: 2006).*

* cited by examiner

[FIG. 1]
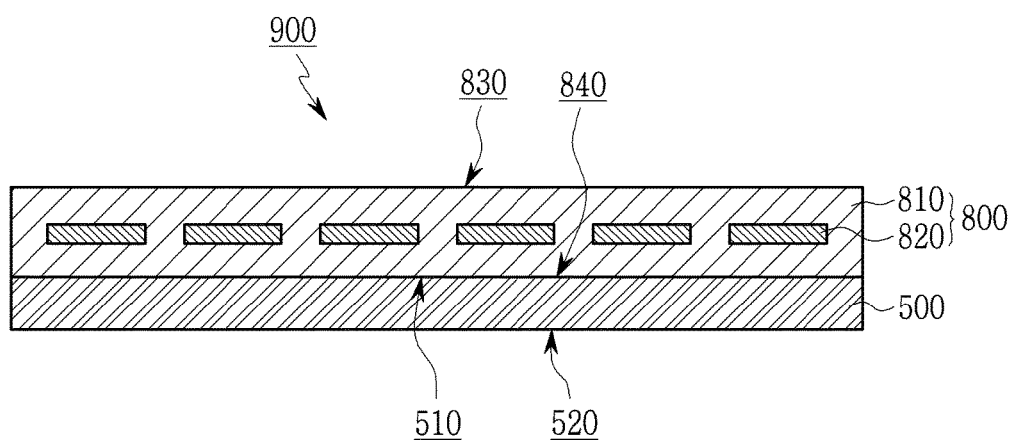
[FIG. 2]
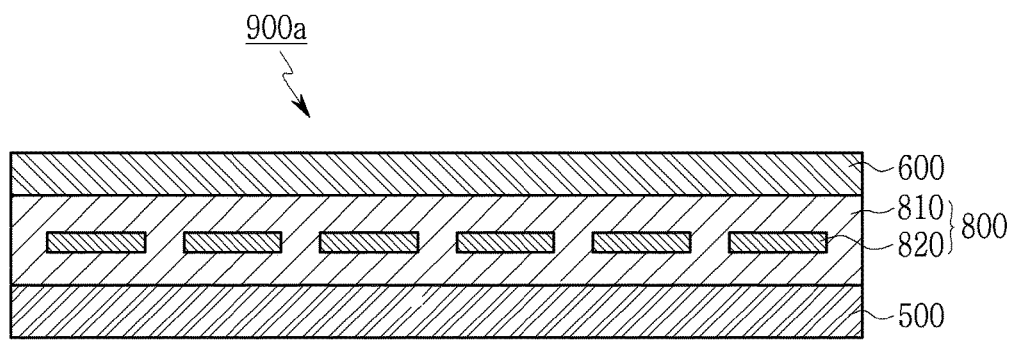

【FIG. 3】
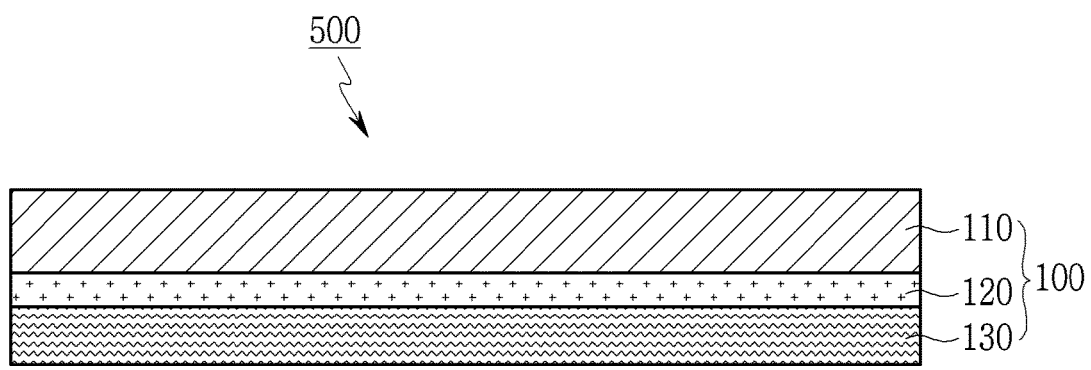
【FIG. 4】
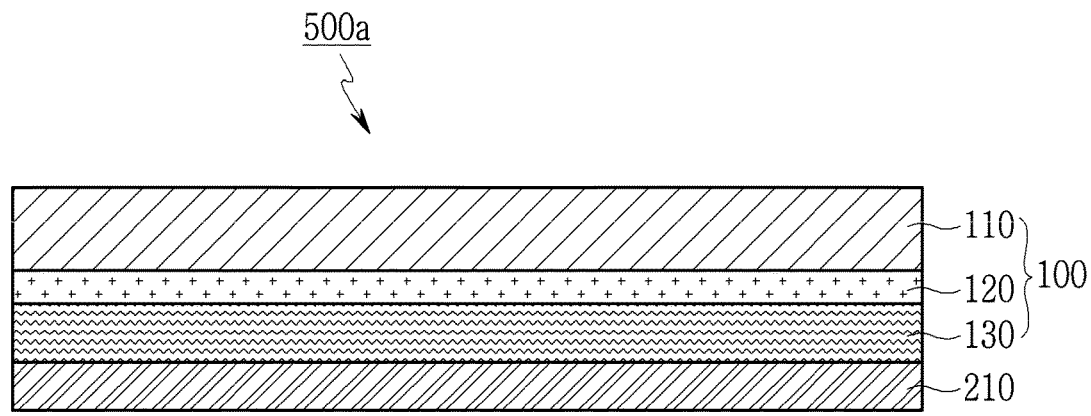

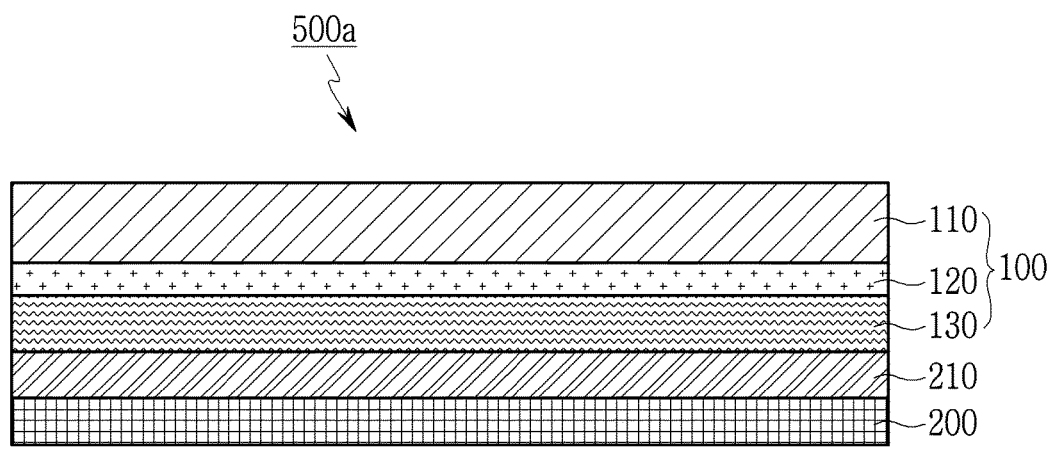
[FIG. 5]
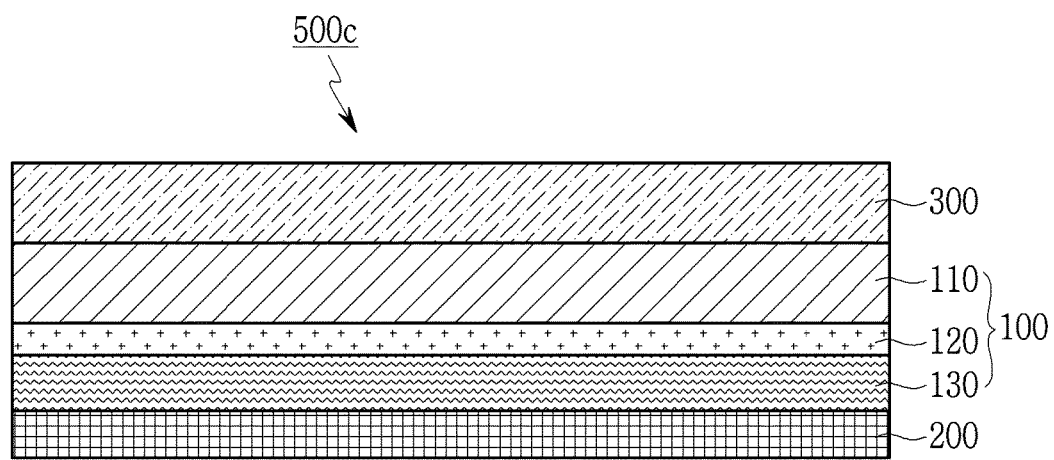
[FIG. 6]

【FIG. 7】
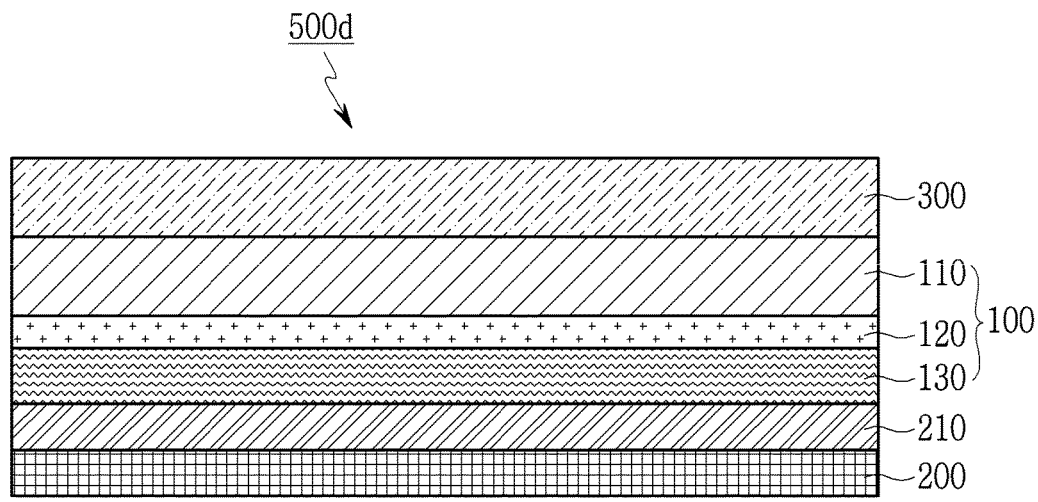
【FIG. 8】
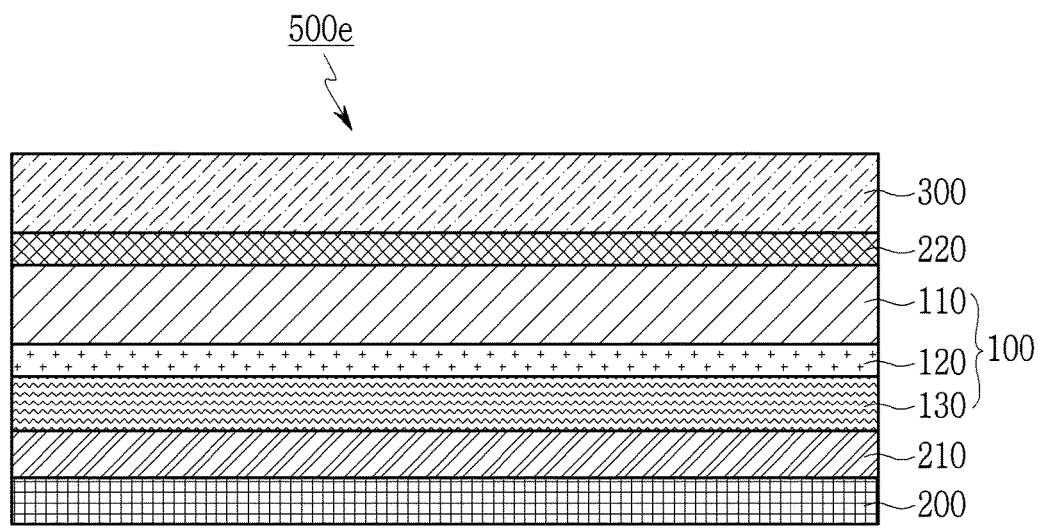

BACK SHEET, METHOD OF MANUFACTURING THE SAME, SOLAR CELL MODULE USING THE SAME AND METHOD OF MANUFACTURING SOLAR CELL

CROSS-REFERENCE TO RELATED APPLICATION

This application claims priority to and the benefit of Korean Patent Application No. 10-2015-0153273 filed in the Korean Intellectual Property Office on 2015 Nov. 2 and Korean Patent Application No. 10-2015-0161695 filed in the Korean Intellectual Property Office on 2015 Nov. 18 the entire contents of which are incorporated herein by reference.

BACKGROUND OF THE INVENTION (a) Field of the Invention

The present invention relates to a back sheet, a method of manufacturing the same, a solar cell module using the same and a method of manufacturing the solar cell module.

(b) Description of the Related Art

Recently, necessity of clean alternative energy is growing due to depletion of fossil fuels and global warming by carbon dioxide. Therefore, various alternative energy sources such as wind power, bio-gas, hydrogen fuel cell, nuclear power, solar heat, geothermal heat, and so on are being developed. A solar cell using solar energy is one of the alternative energy sources.

Generally, a solar cell module includes a substrate made of glass or glass-like material, a solar cell, an encapsulation, and a protective sheet for a back surface (back sheet).

Since one solar cell cannot output sufficient power, a plurality of solar cells are disposed in series or parallel on the substrate and are electrically connected to each other so as to form one solar cell module. In addition, the back sheet is bonded to the encapsulation for attaching the solar cells at a back surface of the solar cell module and protects the solar cell module against physical impact from external environment or water and contaminant.

Generally, sunlight projected into the solar cell module is reflected at the back sheet between one solar cell and another solar cell and is totally reflected toward the substrate so as to be transmitted to the solar cell. Therefore, back sheet is required to have high reflectivity in order to increase power capacitance of the solar cell module under predetermined dimensions.

A conventional back sheet is made of milky white material in order to increase reflectivity of the back sheet used in the solar cell module. In addition, content of titanium dioxide may be adjusted or a light diffusion layer or a light reflection layer is formed on a surface of the back sheet in order to increase reflectivity.

However, increase of content of titanium dioxide in the back sheet is limited due to physical properties. In addition, if the light diffusion layer or the light reflection layer is formed, durability of the back sheet may be deteriorated or manufacturing cost may increase.

It is disclosed in Japanese Patent Laid-Open Publication No. 2006-319250 that a back sheet for a solar cell includes a light diffusion layer having a fine convex portion or a fine recess portion and a metal deposit layer having reflectivity and gas barrier. However, Japanese Patent Laid-Open Publication No. 2006-319250 has problems of high manufacturing cost and requiring high-technology in order to form the light diffusion layer having the fine convex portion or the fine recess portion.

In a case that the solar cell module is located in a desert area where there are a lot of sunlight, a lot of power can be produced.

However, cycle-life of the solar cell module is short and cost for maintaining and replacing the solar cell module is high in the desert area because much ultraviolet rays are irradiated, midday temperature is very high, temperature difference between day and night is very large, and sandblast damages the solar cell module. Therefore, cost performance of the solar cell module is very low.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a solar cell module having advantages of improving durability, weather resistance and generator efficiency.

Another embodiment of the present invention provides a solar cell module having further advantages of improving generator efficiency at harsh environment such as desert area and increasing convenience of installing and managing the solar cell module.

A back sheet for a solar cell module according to one aspect of the present invention may include: an electric insulating base film layer; a resin coating layer formed at a part or all of at least one surface of the base film layer and containing polyester components, polyurethane components or all of the polyester components and the polyurethane components; and a reflective film positioned on the resin coating layer and including a deposited reflective layer including metal and having 2 or higher optical density (OD).

The back sheet for the solar cell module may further include: an UV blocking layer positioned on a part or all of one surface or both surfaces of the reflective film and having 5% or lower transmittance of light at 380 nm wavelength.

The resin coating layer includes an aqueous urethane resin layer including polyester components and polyurethane components, wherein weight ratio of the polyester components to the polyurethane components is 1:1 to 5. The polyurethane components may include dicarboxylic acid compound, glycol compound and diisocyanate compound, wherein the glycol compound includes more than two types of compound selected from the group consisting of ethylene glycol, 1,2-propanediol, 1,3-propanediol, 1,4-butanediol, neopentyl glycol, 1,6-hexanediol, 1,2-cyclohexane dimethanol, 1,3-cyclohexane dimethanol, 1,4-cyclohexane dimethanol, p-xylene glycol, diethylene glycol, triethylene glycol, polyether glycol, polyethylene glycol and polytetramethylene glycol.

The back sheet for the solar cell module may further include a protecting film positioned on the UV blocking layer formed at one surface of the reflective film and a first adhesive layer contacting with the reflective film.

Thermal conductivity of the back sheet may be 0.2 to 0.3 W/mK (70° C.).

Reflectivity of the back sheet may be 75 to 80% at visible ray region (400-780 nm) and 60 to 65% at near-infrared region (780-2500 nm).

Adhesion between layer of the resin coating layer is higher than or equal to 3N/cm under 85° C./85% RH and 1,000 hr operation condition.

A method of manufacturing a back sheet for a solar cell module according another aspect of the present invention may include: a step of forming a resin coating layer where a resin composition is coated on one surface of an electric insulating base film layer; and a step of forming a deposited reflective layer where a reflective layer including metal is deposited on the resin coating layer such that optical density (OD) of the deposited reflective layer is higher than or equal to 2, wherein the resin composition includes polyester components, polyurethane components or all of the polyester components and the polyurethane components.

The method may further include a step of forming an UV blocking layer after the step of forming a deposited reflective layer, wherein a layer having 5% or lower transmittance at 380 nm wavelength is formed using an adhesive including an ultraviolet (UV) stabilizer in the step of forming an UV blocking layer.

The resin coating layer may include an aqueous urethane resin composition including polyester components and polyurethane components, wherein weight ratio of the polyester components to the polyurethane components is 1:1 to 5.

A solar cell module according to other aspect of the present invention may include: a solar module portion including an electric isolating encapsulation and a unit cell positioned in the encapsulation; and a back sheet positioned at a back surface of the solar module portion and protecting the solar module portion, wherein the back sheet includes a reflective film including a deposited reflective layer including metal and having 2 or higher optical density (OD), and an UV blocking layer positioned below the reflective film and having 5% or lower transmittance of light at 380 nm wavelength, and wherein the reflective film reflects light passing through the solar module portion back into the solar module portion and reflects light or radiation heat input through a back surface of the back sheet.

The reflective film may include: a base film layer; a deposited reflective layer positioned below the base film layer; and a resin coating layer positioned between the base film layer and the deposited reflective layer and bonding the deposited reflective layer and the base film layer, wherein adhesion between layer of the resin coating layer is higher than or equal to 3N/cm under 85° C./85% RH and 1,000 hr operation condition.

The back sheet may further include a protecting film positioned below the UV blocking layer, wherein the protecting film is any one selected from the group consisting of fluorine resin, anti-hydrolysis polyethylene, polyethylene naphthalate and a combination thereof.

The back sheet may further include a second adhesive layer positioned on the reflective film, wherein transmittance of the second adhesive layer at 380 nm wavelength is lower than or equal to 5%.

Thermal conductivity of the back sheet is 0.2 to 0.3 W/mK (70° C.).

Reflectivity of the back sheet may be 75 to 80% at visible ray region (400-780 nm) and 60 to 65% at near-infrared region (780-2500 nm).

According to exemplary embodiments of the present invention, characteristics of the solar cell module such as durability and weather resistance may be improved and generator efficiency of the solar cell module may be increased.

In addition, generator efficiency of the solar cell module may be increased and convenience of installing and man-aging of the solar cell module may be improved. Solar energy may be generated under harsh environment such as in desert area.

BRIEF DESCRIPTION OF THE DRAWINGS

FIG. 1 is a cross-sectional view of a solar cell module according to an exemplary embodiment of the present invention.

FIG. 2 is a cross-sectional view of a solar cell module according to another exemplary embodiment of the present invention.

FIG. 3 to FIG. 8 are cross-sectional views of a back sheet applied to a solar cell module illustrated in FIG. 1 and FIG. 2.

DETAILED DESCRIPTION OF THE EMBODIMENTS

In this specification, an expression "one layer is positioned/disposed on or above another layer" means that one layer is separated from another layer and is positioned/disposed on or above another layer with or without contacting to another layer, and includes that at least one other layer is disposed between one layer and another layer.

In this specification, an expression "combination thereof" means more than one combination of any constituent elements selected from the group consisting of the constituent elements.

In this specification, an expression "A and/or B" means "A, B, or A and B".

In this specification, an expression "a step of doing something" does not mean "a step for doing something".

In this specification, expressions like "first" and "second" or "A" and "B" are used to distinguish between them and should not be construed as being limited thereto.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention. Like reference numerals designate like elements throughout the specification.

Referring to FIG. 1 to FIG. 8, a back sheet, a method of manufacturing the same, a solar cell module using the same and a method of manufacturing a solar cell module will hereinafter be described.

Firstly, referring to FIG. 1, a solar cell module according to an exemplary embodiment of the present invention will be described.

As shown in FIG. 1, a solar cell module 900 according to the present exemplary embodiment includes a solar module portion 800 and a back sheet 500 positioned under the solar module portion 800.

If sunlight is input through an incidence surface 830, the solar module portion 800 performs photoelectric conversion by using the sunlight of wavelength of power generating region. The solar module portion 800 is core portion of a solar cell.

The solar module portion 800 includes an encapsulation 810 filling in a part or all of an inside of the solar module portion 800 and at least one solar cell 820 (hereinafter, the solar cell will be called 'unit cell') enclosed by the encapsulation 810.

Outer surfaces of the solar module portion 800 include the incidence surface 830 into which the sunlight of wavelength of power generating region is input and a back surface 840 opposite to and facing the incidence surface 830.

The incidence surface 830 and the back surface 840 may be integrally formed with the encapsulation 810 or may be separately formed from and be attached on the encapsulation 810. It is preferable for thin and light solar cell module 900 that the incidence surface 830 and the back surface 840 are integrally formed with the encapsulation 810.

The encapsulation 810 may be made of ethylene vinyl acetate (EVA) that is widely used as electric isolating sealing material. Since the encapsulation may be made of any material that can be used as electric isolating sealing material, material of the encapsulation is not limited to EVA.

In addition, since the encapsulation 810 can be formed by pressing a first encapsulation, the unit cell 820, and a second encapsulation that are sequentially stacked when assembling the solar module portion 800 or the solar cell module 900 including the same, the encapsulation 810 may include the first encapsulation and the second encapsulation.

A plurality of unit cells 820 in one encapsulation 810 may be electrically connected to each other so as to improve generator efficiency of the unit cells 820. In this case, the plurality of unit cells 820 are electrically connected through an interconnector ribbon or a bus bar ribbon. However, the electric connection of the plurality of unit cells 820 is not limited thereto.

A plurality of unit cells 820 may be disposed to form a predetermined matrix in one encapsulation 810. However, if necessary, the unit cells 820 having different characteristics from each other may be alternately disposed.

The solar module portion 800 may include a plurality of first unit cells facing and disposed in parallel with the incidence surface 830 and a plurality of second unit cells. A distance between the second unit cell and the incidence surface 830 may be different from that between the first unit cell and the incidence surface 830.

In addition, more than two sets of unit cells 820 may be included in one encapsulation 810. A set of unit cells 820 is formed at a predetermined height to form the predetermined matrix. More than two sets of unit cells 820 are positioned at different heights.

The solar module portion 800 may further include a junction box (not shown) directly or indirectly connected to at least one of the plurality of unit cells 820 which are electrically connected to each other.

In addition, an electric connection member such as a ribbon connected to the junction box may include an anti-contamination coating film (not shown) coated thereon or may be treated with anti-contamination. Temperature of the junction box may be raised by adsorption of foreign particles such as dusts, and thereby fire may occur in the junction box and the solar cell module 900 may be damaged. If the junction box is treated with anti-contamination, such damages can be prevented.

As shown in FIG. 2, the solar cell module 900a according to another exemplary embodiment, different form the solar cell module 900 according to the present exemplary embodiment, further includes a light transmission layer 600 positioned on the solar module portion 800. Other elements 800 and 500 of the solar cell module 900a are the same as those of the solar cell module 900 shown in FIG. 1.

The light transmission layer 600 according to another exemplary embodiment is positioned above the incidence surface 830 of the solar module portion 800 or contacts with the incidence surface 830, protects the solar module portion 800, and helps the light pass through the incidence surface 830 and reach the unit cell 820 easily. Herein, the light means light projected into the solar cell module 900a including the sunlight of wavelength of power generating region.

The light transmission layer 600 may be a sheet or a plate made of glass or synthetic resin, etc.

In addition, the light transmission layer 600 may be made of tempered glass so as to prevent breakage of the solar cell module 900a by external force, and may have heat-resisting property so as to have excellent durability under quick temperature change.

A surface of the light transmission layer 600 may be treated with anti-contamination or may be further provided with anti-contamination coating film (not shown). In this case, attachment of contaminants such as dust and sand to the surface of the light transmission layer 600 may be reduced.

Therefore, generator efficiency of the solar cell module 900a may be increased or convenience of managing the solar cell module 900a may be improved.

In addition, the light transmission layer 600 may further include a protecting layer (not shown) on a front surface and/or a back surface of the light transmission layer 600. The protecting layer can block ultraviolet rays due to external environment of the solar cell module 900a.

If the protecting layer for blocking the ultraviolet rays is positioned on at least one surface of the light transmission layer 600, yellowing of the encapsulation 810 may be reduced. In addition, deterioration of output power or acceleration of aging of the solar cell module 900a may be prevented.

The back sheet 500 applied to the solar cell module 900 and 900a according to exemplary embodiments is positioned close to the back surface 840 of the solar cell module 900 and 900a and protects the solar module portion 800.

The back sheet 500 includes a front surface 510 positioned close to or on the back surface 840 of the solar module portion 800 and a back surface 520 facing the front surface 510.

The back sheet 500 protects the solar module portion 800 against external environment such as dust, impact, and moisture, and helps the solar module portion 800 generate electricity stably for a long time. In order to achieve necessary functions, the back sheet 500 has composite structure where a plurality of layers of film type is bonded to each other.

Referring to FIG. 3 to FIG. 8, the back sheets 500 and 500a to 500e according to various exemplary embodiments applied to the solar cell module 900 and 900a will be described.

In FIG. 3 to FIG. 8, like reference numerals designate like elements and detailed description thereof will be omitted.

The solar cell modules 900 and 900a shown in FIG. 1 and FIG. 2 are just examples of the solar cell modules provided with the back sheet 500. However, any one of various back sheets 500a to 500e can be applied to the solar cell module 900 and 900a.

Referring to FIG. 3, the back sheet 500 includes an electric insulating base film layer 110, a resin coating layer 120 formed at a part or all of at least one surface of the base film layer 110 (for example, a lower surface of the base film layer 110) and containing polyester components, polyurethane components or all of them, and a deposited reflective layer 130 positioned under the resin coating layer 120, being a deposited layer containing metal, and having 2 or higher optical density (OD). These layers 110, 120, and 130 are included in a reflective film.

In the present exemplary embodiment, the base film layer 110 is close to the front surface 510 and the deposited reflective layer 130 is far from the front surface 510. On the contrary, the base film layer 110 is close to the back surface 520 and the deposited reflective layer 130 is far from the back surface 520.

The base film layer 110 may serve as basic material of deposit process and as a control layer which can control refracting path.

The base film layer 110 is preferably made of an electric isolating transparent film, and more particularly, made of any one selected from the group consisting of polyethylene terephthalate (PET), polyphenylene sulfide (PPS), polyethylene naphthalate (PEN), polyvinyl fluoride (PVF), polyvinylidene fluoride (PVDF), ethylene tetrafluoroethylene (ETFE), Ethylene ChloroTriFluoroEthylene (ECTFE) and combinations thereof.

It is not preferable that the base film layer 110 is made of glass plate. Compared to the base film layer in the back sheet 500 made of the glass plate, the base film layer 110 of the plastic film according to the present exemplary embodiments has advantages of improving convenience of installing and managing the solar cell module 900 and 900a.

The base film layer 110 serves as basic material of the deposited reflective layer 130 by directly depositing the deposited reflective layer 130 on one surface of the base film layer 110 or by depositing the deposited reflective layer 130 through the resin coating layer 120 on the one surface of the base film layer 110. Therefore, it is preferable that the base film layer 110 hardly modifies and transforms in the deposit process, has excellent dimensional stability under repetitive temperature changes when applied to the solar cell module, and has sufficient durability.

A biaxial oriented polyester film may be preferably used as the base film layer 110. In this case, the base film layer 110 has stable dimensional stability characteristics.

A polyester film containing more than 60 wt % of EthyleneTerePhthalate in a repeating unit may be used as the base film layer 110. The polyester film is made by biaxially stretching a resin composition having limiting viscosity of 0.4 to 0.9 dl/g. If the polyester film is used as the base film, electric isolation and mechanical strength may be excellent, modification of the base film when forming the deposited reflective layer may be small, and dimensional stability may be excellent under repetitive temperature and humidity changes when the base film is used in the solar cell module 900 and 900a.

The resin coating layer 120, as shown in FIG. 3, is formed on the base film layer 110. The resin coating layer 120 enhances adhesion of the deposited reflective layer 130 containing metal and the base film layer 110 and thereby improves stability and durability of the film.

In more detail, the resin coating layer 120 is formed by coating a resin composition on the base film layer 110 including polyester components such as aqueous polyester components, polyurethane components or both of them and then drying the resin composition.

A resin applied to the resin coating layer 120 may be aqueous polyester resin or polyurethane resin rather than aqueous acryl resin.

If urethane resin including both of aqueous polyester resin and polyurethane resin (copolymerization resin coating layer) is used as the resin coating layer 120, adhesion between layers and adhesion to base material may be excellent. Therefore, adhesion between a metal surface and polymer sheet surface may be maintained.

The resin coating layer 120 may be urethane resin coating layer (copolymerization resin coating layer) in which weight ratio of polyester components to polyurethane components is 1:1 to 5 or urethane resin coating layer (copolymerization resin coating layer) in which weight ratio of polyester components to polyurethane components is 1:2 to 4. If the polyester components and the polyurethane components are with in such weight ratio, adhesion to the deposited reflective layer may be maintained under high temperature and dampness environments.

The resin coating layer 120 may include aqueous polyurethane resin (copolymerization resin coating layer) manufactured by copolymerizing dicarboxylic acid component, glycol component, diisocyanate component and components (polyester components) represented as Chemical Formula 1.

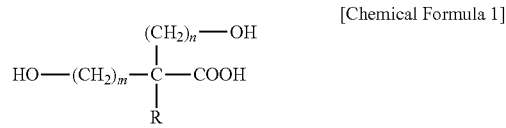

[Chemical Formula 1]

In Chemical Formula 1, R represents aliphatic hydrocarbon with carbon number 1 to 30, and n and m represents an integer ranging of 1 to 5, respectively.

Diisocyanate component is compound represented by the following Chemical Formula 2.

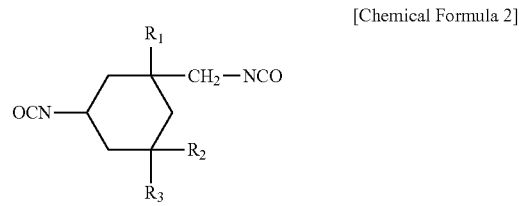

[Chemical Formula 2]

In Chemical Formula 2, each of $R_1$, $R_2$ and $R_3$ is aliphatic hydrocarbon radical with carbon number 1 to 30.

The resin coating layer 120 may be copolymerization resin coating layer formed by coating the aqueous polyurethane resin of 0.01 to 0.5 g/m² manufactured by copolymerizing dicarboxylic acid component, glycol component, diisocyanate component and the component represented by Chemical Formula 1 on the base film layer 110 and then drying the aqueous polyurethane resin.

In more detail, the polyurethane components applied to the resin coating layer 120 include dicarboxylic acid compound, glycol compound and diisocyanate compound.

The dicarboxylic acid compound may be aromatic dicarboxylic acid such as terephthalic acid, isophthalic acid, 1,4-naphthalene dicarboxylic acid, 2,5-naphthalene dicarboxylic acid, 2,5-methylterephthalic acid, dimethyl isophthalic acid and so on, alicyclic dicarboxylic acid such as 1,3-cyclopentane dicarboxylic acid, 1,2-cyclohexane dicarboxylic acid, 1,3-cyclohexane dicarboxylic acid, 1,4-cyclohexane dicarboxylic acid and so on, aliphatic dicarboxylic acid such as adipic acid, sebacic acid and so on, and combination thereof. If the aromatic dicarboxylic acid is used as dicarboxylic acid compound, adhesion may be improved.

The glycol compound may be aliphatic glycol with carbon number 2 to 8 and alicyclic glycol with carbon number 6 to 12. For example, the glycol compound may be ethylene glycol, 1,2-propanediol, 1,3-propanediol, 1,4-butanediol, neopentyl glycol, 1,6-hexanediol, 1,2-cyclohexane dimethanol, 1,3-cyclohexane dimethanol, 1,4-cyclohexane dimethanol, p-xylene glycol, diethylene glycol, triethylene glycol or combination thereof. In addition, polyether glycol, polyethylene glycol, polytetramethylene glycol, or combination thereof may be used as the glycol compound.

The diisocyanate compound may be 2,4-hexamethylene diisocyanate, 2,6-hexamethylene diisocyanate, 5-isocyanate-1-isocyanatemethyl-1,3,3-trimethyl cyclohexane represented by Chemical Formula 2 and derivative thereof. Preferably, 5-isocyanate-1-isocyanatemethyl-1,3,3-trimethyl cyclohexane and derivative thereof may be used as the diisocyanate compound.

It is preferable that the glycol compound includes more than two types of compounds. In this case, the resin composition keeping stable adhesion under severe environment can be obtained.

In more detail, the resin coating layer 120 may include dimethylterephthalic acid as the dicarboxylic acid compound, ethylene glycol and diethylene glycol as the glycol compound, and 5-isocyanate-1-isocyanatemethyl-1, 3, 3-trimethyl cyclohexane as the diisocyanate compound.

The resin coating layer 120 may be formed by coating the resin composition of 0.01 to 0.5 g/m$^2$ including the aqueous polyester component and polyurethane component on the base film layer 110 and then drying the resin composition.

The resin coating layer 120 may have more than 1.5 N/cm adhesion between layers, more than 2.0 N/cm adhesion between layers, more than 3.0 N/cm adhesion between layers, preferably more than 4.0 N/cm adhesion between layers, and 5.0 N/cm adhesion between layers as its maximum limit after operating the solar cell module for more than 1,000 hr under high temperature and high humidity of 85° C./85% RH.

Since the resin coating layer 120 is disposed between the base film layer 110 and the deposited reflective layer 130, the base film layer 110 and the deposited reflective layer 130 are strongly and stably coupled to each other. Therefore, excellent mechanical properties such as strength, strain, modulus of rigidity may be maintained.

The resin coating layer 120 may have more than 1.5 N/cm adhesion between layers, more than 2.0 N/cm adhesion between layers, more than 3.0 N/cm adhesion between layers, and preferably more than 4.0 N/cm adhesion between layers after operating the solar cell module for more than 1,000 hr under high temperature and high humidity of 85° C./85% RH.

The resin coating layer 120 serves as an adhesive layer as well as a primer when depositing aluminum.

The deposited reflective layer 130 is a deposited layer containing metal serving as a reflective layer.

The deposited reflective layer 130 includes a metal-containing deposited layer. The optical density (OD) of the deposited reflective layer 130 is higher than or equal to 2 and more particularly, is in a range from 2 to 3.5.

If the optical density is lower than 2, reflecting performance is insufficient and the back sheet 500 including the deposited reflective layer 130 having insufficient reflectivity may be manufactured. On the contrary, if the optical density is higher than 3.5, excessive metal component may be used even though increase in reflectivity and improvement of permeability of aqueous vapor may be insignificant. Therefore, it is uneconomical and weight and thickness of back sheet 500 is unnecessarily increased.

Preferably, the optical density of the deposited reflective layer 130 may be 2 to 3. At this time, the modular solar cell module 900 and 900a including the back sheet 500 has excellent reflectivity at the power generating region of the light. Therefore, performance of the solar cell module 900 and 900a may be improved.

The deposited reflective layer 130 reflects the light input to the deposited reflective layer 130. That is, a portion of the light which inputs into the solar cell module 900 and 900a but does not input to the unit cell 820 and passes through the solar module portion 800 is input into the solar module portion 800 again. Through repeating above-mentioned processes, total path of the light input into the solar cell module 900 and 900a is increased and quantity of light per unit time reaching the unit cell 820 is increased.

In addition, the deposited reflective layer 130 reflects the light or radiation heat input to the back surface 520 of the back sheet so as to reduce rise of temperature in the solar module portion 800.

One surface and the other surface of the deposited reflective layer 130 may have different transmission wavelength and reflection wavelength.

In more detail, the one surface among the one surface and the other surface of the deposited reflective layer 130 which reflects the light input into the solar module portion 800 back to the solar module portion 800 has high reflectivity to the light of wavelength of the power generating region and excellent UV transmittance so as to improve generator efficiency and to elongate module cycle-life.

In addition, the other surface of the deposited reflective layer 130 reflecting the light or the radiation heat input to the back surface 520 has excellent transmittance of the light at the wavelength of the power generating region and high reflectivity to the light of the ultraviolet rays region or wavelength corresponding to the radiation heat so as to improve generator efficiency and to elongate module cycle-life of the solar cell module 900 and 900a.

As shown in the drawings, the deposited reflective layer 130 may be formed at one surface or both surfaces of the base film layer 110. It is preferable that the deposited reflective layer 130 is formed at one surface of the base film layer 110 in order to curtail cost and simplify processes. In a case that the deposited reflective layer 130 is formed at one surface or both surfaces of the base film layer 110, the resin coating layer may be disposed between the deposited reflective layer 130 and the base film layer 110.

The metal included in the deposited reflective layer 130 may be at least one selected from the group consisting of zinc, nickel, silver, copper, gold, indium, tin, stainless steel, chromium, titanium, aluminum and combination thereof. In more detail, the deposited reflective layer 130 may be a deposited layer of aluminum metal.

In addition, the deposited reflective layer 130 may be a deposited layer containing platinum, aluminum, nickel, titanium or oxides thereof.

At this time, the deposited reflective layer 130 may be manufactured through vapor deposition method. That is, the metal is heated to a temperature higher than a melting point where vapor pressure of the metal is higher than $10^{-2}$ torr at high vacuum state (for example, lower than about $10^{-3}$ torr or about $10^{-5}$ torr) and then is deposited, or the metal is exposed to shock ion stream and is deposited through mass transfer sputtering.

In such methods, metal vapor or metal atom is evaporated or sputtered and collides with and is deposited on the resin coating layer 120 positioned on the base film 110 to form the deposited reflective layer 130 of thin film shape.

The deposited reflective layer 130 is thin, uniform and fine film type compared to a conventional reflective layer.

Even though the deposited reflective layer 130 is used in a large area, the reflective layer of uniformly excellent quality can be formed.

Preferably, aluminum vapor deposition layer may be used as the deposited reflective layer 130. In this case, the back sheet 500 has advantages of improving reflectivity and realizing barrier against aqueous vapor.

The back sheet 500 may not include a metal layer of foil type. If a conventional metal layer of foil type has a sufficient thickness, the back sheet may have reflection characteristics. However, compared to the deposited reflective layer 130 according to the present exemplary embodiment, the conventional metal layer of foil type is thick and realizes insufficient barrier against aqueous vapor so as to be complemented by another layer of the back sheet.

Even though thickness of the deposited reflective layer 130 according to the present exemplary embodiment is smaller than or equal to about 1000 nm, the back sheet 500 may have sufficient reflection characteristics and realize the barrier against aqueous vapor. Therefore, even though the back sheet 500 is thin and light, the back sheet 500 has sufficient reflection characteristics and generator efficiency of the solar cell module 900 and 900a can be improved.

The deposited reflective layer 130 may be formed through uninterrupted one deposit process or through periodically repeating deposit processes. If the deposited reflective layer 130 is formed through periodically repeating deposit processes, an adhesive layer and/or an UV blocking layer may be additionally formed between deposit processes. In this case, durability or weather resistance of the back sheet 500 may be further improved.

It is preferable that the deposited reflective layer 130 reflects the light of the wavelength of the power generating region among light input through the incidence surface 830 well. Particularly, the surface of the deposited reflective layer 130 close to the back surface 840 of the solar module portion 800 has high reflectivity to the light of the wavelength of the power generating region.

In addition, the surface of the deposited reflective layer 130 close to the back surface 520 of the back sheet 500 has high reflectivity to the radiation heat input through the back surface 520 of the back sheet 500. The surface of the deposited reflective layer 130 having high reflectivity to the radiation heat has high reflectivity to infrared wavelength that is comparatively long wavelength.

As described above, the both surfaces of the deposited reflective layer have different reflectivity characteristics. The deposited reflective layer may be formed by using a base film having protrusions and depressions, changing microstructure of the surfaces of the deposited reflective layer, or adding a control layer (not shown) for controlling a refraction path of the light at more than one surface of the deposited reflective layer or in the deposited reflective layer.

As shown in FIG. 4, back sheet 500a according to another exemplary embodiment further includes an UV blocking layer 210 disposed below the deposited reflective layer 130.

The UV blocking layer 210 has 5% or lower transmittance of the light at 380 nm wavelength.

The UV blocking layer 210 may be a polymer resin layer including an ultraviolet (UV) stabilizer and may have adhesive characteristics.

The UV blocking layer 210 faces the deposited reflective layer 130 of the reflective film 100. If necessary, the UV blocking layer 210 is formed at the other surface of the reflective film 100.

As described above, the UV blocking layer 210 has 5% or lower transmittance of the light at 380 nm wavelength. Preferably, the UV blocking layer 210 has 3% or lower transmittance of the light at 380 nm wavelength. Further preferably, the UV blocking layer 210 has 1.5% or lower transmittance of the light at 380 nm wavelength. Since the UV blocking layer 210 having low transmittance is used in the back sheet 500a, deterioration of durability to ultraviolet rays and yellowing may be prevented.

The ultraviolet (UV) stabilizer may be benzophenone ultraviolet (UV) stabilizer, benzotriazole ultraviolet (UV) stabilizer, salicylate ultraviolet (UV) stabilizer, or a combination thereof.

The benzophenone ultraviolet (UV) stabilizer may be 2-hydroxy-4-octoxybenzophenone, 2-hydroxy-4-methoxy-5-sulfonebenzophenone or combination thereof, the benzotriazol ultraviolet (UV) stabilizer may be 2-(2-hydroxy-5-methyl phenyl)benzotriazol or derivatives thereof, and the salicylate ultraviolet (UV) stabilizer may be phenylsalicylate, p-t-butylphenylsalicylate or combination thereof.

As shown in FIG. 5, the back sheet 500b further includes a protecting film 200 disposed below the UV blocking layer 210.

The protecting film 200 protects the back sheet 500b against external environment and is formed integrally with or separately from the back surface 520. The protecting film 200 may be a film including any one selected from the group consisting of fluorine resin, anti-hydrolysis polyethylene, polyethylene naphthalate and a combination thereof.

For example, the protecting film 200 may be any one selected from the group consisting of polyethylene terephthalate (PET), polyphenylene sulfide (PPS), polyethylene naphthalate (PEN), polyvinyl fluoride (PVF), polyvinylidene fluoride (PVDF), ethylene tetrafluoroethylene (ETFE), polychlorotrifluoroethylene (PCTFE), Ethylene ChloroTriFluoroEthylene (ECTFE), polyethylene(PE), polypropylene (PP), ethylenevinylacetate (EVA) and a combination thereof. Preferably, the protecting film 200 may be any one selected from the group consisting of polyvinyl fluoride (PVF), polyvinylidene fluoride (PVDF), polyethylene terephthalate (PET), Ethylene ChloroTriFluoroEthylene (ECTFE) and a combination thereof. In this case, durability and weather resistance may be improved.

The protecting film 200 may be a transparent film or an opaque film having color. At this time, the color of the protecting film 200 may preferably be white or black. The white or black film may be manufactured by applying pigment to the film or separately forming a color layer.

In addition, as shown in FIG. 6, the back sheet 500c according to another exemplary embodiment is produced by adding the protecting film 200 and the first adhesive layer 300 to the back sheet 500a illustrated in FIG. 4.

As shown in FIG. 6, the first adhesive layer 300 is positioned on the reflective film 100 and contacts with the encapsulation 810 of the solar module portion 800, and the protecting film 200 is positioned below the reflective film 100 and protects the reflective film 100 against the external environment.

The first adhesive layer 300 may be any one selected from the group consisting of polyethylene terephthalate (PET), polyphenylene sulfide (PPS), polyethylene naphthalate (PEN), polyvinyl fluoride (PVF), polyvinylidene fluoride (PVDF), ethylene tetrafluoroethylene (ETFE), polychlorotrifluoroethylene (PCTFE), Ethylene ChloroTriFluoroEthylene (ECTFE), polyethylene (PE), polypropylene (PP), ethylenevinylacetate (EVA) and a combination thereof. Preferably, the first adhesive layer 300 may be any one selected from the group consisting of the polyvinyl fluoride (PVF), polyethylene (PE), ethylenevinylacetate (EVA) and a combination thereof.

In addition, the back sheet 500*d* illustrated in FIG. 7 includes the UV blocking layer 210 between the reflective film 100 and the protecting film 200. In this case, the UV blocking layer 210 blocks UV and helps adhesion of the reflective film 100 and the protecting film 200.

The back sheet 500*e* illustrated in FIG. 8 includes the second adhesive layer 220 between the reflective film 100 and the first adhesive layer 300.

At this time, the second adhesive layer 220 firmly attaches the first adhesive layer 300 to the reflective film 100 and may block the UV.

That is, the second adhesive layer 220 may be an adhesive layer including an ultraviolet (UV) stabilizer. The ultraviolet (UV) stabilizer may be benzophenone ultraviolet (UV) stabilizer, benzotriazol ultraviolet (UV) stabilizer, salicylate ultraviolet (UV) stabilizer or a combination thereof.

The benzophenone ultraviolet (UV) stabilizer may be 2-hydroxy-4-octoxybenzophenone, 2-hydroxy-4-methoxy-5-sulfonebenzophenone or combination thereof, the benzotriazol ultraviolet (UV) stabilizer may be 2-(2-hydroxy-5-methyl phenyl)benzotriazol or derivatives thereof, and the salicylate ultraviolet (UV) stabilizer may be phenylsalicylate, p-t-butylphenylsalicylate or combination thereof.

The second adhesive layer 220 may serve as the UV block layer. In this case, the second adhesive layer 220 has 5% or lower transmittance of the light at 380 nm wavelength. In further detail, the second adhesive layer 220 may be the adhesive layer including the ultraviolet (UV) stabilizer or a light converting material. Since the ultraviolet (UV) stabilizer is described above, detailed description thereof will be omitted.

The protecting film 200 and the first adhesive layer 300 may be transparent films or opaque films having color according to a type of a solar cell module.

At this time, the color of the protecting film 200 and the first adhesive layer 300 may preferably be white or black. The white or black film may be manufactured by applying pigment to the protecting film 200 or the first adhesive layer 300 or separately forming a color layer.

The opaque film having color is positioned at the outermost surface of the back sheet when the back sheet is mounted at the solar cell module 900 and 900*a*.

The back sheet 500 to 500*e* according to exemplary embodiments may be a film laminate including various types of polymer resins and a deposited layer containing metal or be a film laminate including the polymer resin provided with a polymer sheet and/or an adhesive layer and a deposited layer containing metal.

Thermal conductivity of the back sheet 500 to 500*e* according to exemplary embodiments may be 0.2 to 0.3 W/mK (70° C.). That is, the exemplary embodiments show excellent thermal conductivity and can radiate heat easily, compared to a conventional back sheet. Therefore, if the back sheet 500 to 500*e* having such thermal conductivity is used, the back sheet 500 to 500*e* can protect the solar cell module well under high temperature environment or big temperature change environment.

The back sheet 500 to 500*e* according to the exemplary embodiments includes the reflective film 100 and has excellent reflectivity. For example, reflectivity of the back sheet 500 to 500*e* may be 75 to 80% at a visible ray region (400-780 nm) and 60 to 65% at a near-infrared region (780-2500 nm). If the back sheet 500 to 500*e* according to the exemplary embodiments is used in the solar cell module, the back sheet 500 to 500*e* can reflect the light input through the front surface of the solar cell module back to the solar module portion 800 and increases quantity of the light input into the solar cell. Therefore, generator efficiency of the solar cell per unit time and unit area may be increased.

The back sheet 500 to 500*e* increases quantity of the light input into the solar cell unit, and thus increases generator efficiency of the solar cell per unit time and unit area. In addition, the back sheet 500 to 500*e* reflects radiation heat input through the back surface of the solar cell module. Therefore, the back sheet 500 to 500*e* suppresses or reduces temperature rise of the solar cell module due to radiation heat from the ground.

Water vapor permeability (38° C. and 90% relative humidity condition) of the back sheet 500 to 500*e* according to the exemplary embodiments may be lower than or equal to 0.75 g/m$^2$ day, lower than or equal to 0.65 g/m$^2$ day, or be 0.58 to 0.63 g/m$^2$ day. Since the back sheet 500 to 500*e* includes the deposited reflective layer 130 and the resin coating layer 120, the back sheet 500 to 500*e* realizes barrier against aqueous vapor under high temperature and humidity condition and has excellent durability under severe environment.

If the back sheet 500 to 500*e* according to the exemplary embodiments is used in the solar cell module, deterioration of durability may be postponed and temperature rise of the solar cell module may be reduced.

Thickness of the reflective film 100 according to the exemplary embodiments may be smaller than or equal to 300 um and may preferably be smaller than or equal to 210 um.

Thickness of the back sheet 500 to 500*e* according to the exemplary embodiment may be smaller than or equal to 500 um and may preferably be smaller than or equal to 400 um. Since the back sheet is thin and light, workability may be improved but functions of the back sheet may be maintained.

Since the back sheet 500 to 500*e* is thin but has high reflectivity and excellent durability, occurrence of crack at the back surface may be prevented under severe environment such as high temperature and sandstorm. In addition, if the back sheet 500 to 500*e* is used in the solar cell module, the solar cell module can be sufficiently protected without mounting a supporting plate or a protecting plate at the back surface of the solar cell module.

The solar cell module 900 and 900*a* according to exemplary embodiments may further include a frame (not shown) covering side surfaces of the solar module portion 800 and the back sheet 500 to 500*e*. The frame fixes the solar module portion 800 and the back sheet 500 to 500*e* and may be made of aluminum or the like.

The frame may have a reflectivity layer like the metal foil at an internal surface of the frame contacting with the back sheet 500 to 500*e* and/or the solar module portion 800. In this case, the light input through the side surfaces of the back sheet and/or the solar module portion is reflected back to the back sheet or the solar module portion. Therefore, generator efficiency of the solar cell module 900 and 900*a* may be improved.

A method of manufacturing the solar cell module according to another exemplary embodiment of the present invention includes a preparing step where the back sheet, the second encapsulation sheet, the unit cell and the first encapsulation sheet are sequentially stacked up so as to produce a laminate for the solar cell module and a thermocompression step where the encapsulation is made from the first encapsulation sheet and the second encapsulation sheet by compressing and heating the laminate for the solar cell module.

The back sheet is manufactured by the method including a step of forming the resin coating layer where a resin composition is coated on one surface of the base film layer 110 so as to form the resin coating layer 120, a step of manufacturing the reflective film where a layer containing metal is deposited on the resin coating layer 120 through vapor deposition method so as to form the deposited reflective layer 130, and a step of forming the UV blocking layer where the UV blocking layer containing the ultraviolet (UV) stabilizer is formed at one surface of both sides of the reflective film 100. The optical density (OD) of the deposited reflective layer 130 is greater than or equal to 2, and the transmittance at 380 nm wavelength of the UV blocking layer is lower than or equal to 5%.

The step of forming the resin coating layer includes aqueous urethane resin composition on the base film layer 110. The aqueous urethane resin composition includes a mixture of polyester component and polyurethane component, and weight ratio of the polyester component to the polyurethane component is 1:1 to 5.

The resin coating layer 120 may have more than 3N/cm adhesion between layers after operating the solar cell module for more than 1,000 hr under high temperature and high humidity of 85° C./85% RH.

As described above, the metal is heated to a temperature higher than a melting point where vapor pressure of the metal is higher than $10^{-2}$ torr at high vacuum state (for example, lower than about $10^{-3}$ torr or about $10^{-5}$ torr) and then is deposited, or the metal is exposed to shock ion stream and is deposited through mass transfer sputtering in the step of forming the deposited reflective layer.

Metal vapor or metal atom is evaporated or sputtered and collides with and is deposited on a surface of the resin coating layer on the base film. Therefore, the deposited reflective layer 130 is formed in thin film shape.

The reflective film 100 including the base film layer 110, the resin coating layer 120 and the deposited reflective layer 130 protects the solar cell module, improves generator efficiency, is easily replaced, and has sufficient durability in the desert area of high temperature. Thin and light reflective film having sufficient durability and reflectivity should be used in the solar cell module in order to reduce weight of the back sheet for the solar cell module.

A layer is formed using adhesive including the ultraviolet (UV) stabilizer such that the UV blocking layer 210 has transmittance at 380 nm wavelength lower than 5%, 3%, or preferably 1.5% in the step of forming the UV blocking layer.

Since the UV blocking layer 210 having low transmittance is used in the back sheet, deterioration of durability to ultraviolet rays and yellowing may be prevented.

Since the ultraviolet (UV) stabilizer is described above, detailed description thereof will be omitted.

In addition, the method of manufacturing the back sheet may further include a step of laminating the protecting film 200 on the reflective film 100 such that the protecting film 200 is positioned below the UV blocking layer 210 or the reflective film 100, and a step of laminating the first adhesive layer 300 on the other surface of the reflective film 100 which is opposite to the one surface of the reflective film 100 contacting with the UV blocking layer 210. Since the protecting film and the first adhesive layer 300 are described above, detailed description thereof will be omitted.

The method of manufacturing the back sheet according to the present exemplary embodiment further includes a step of forming the second adhesive layer between the first adhesive layer 300 and the reflective film 100. The second adhesive layer 220 may be applied to the UV blocking layer 210 and further includes the ultraviolet (UV) stabilizer. In this case, the step of forming the first adhesive layer 300 positioned above the second adhesive layer 220 may be further included.

The back sheet according to the present exemplary embodiment has excellent reflectivity, weather resistance and durability, and realizes barrier against aqueous vapor, compared to the back sheet using glass.

The back sheet according to exemplary embodiments of the present invention has excellent durability, weather resistance and mechanical strength and stability under severe environment where the back sheet is exposed to strong ultraviolet rays and high temperature in long term, there is strong possibility of occurrence of crack due to sharp temperature change, the humidity is high, and there is strong possibility of being damaged by sand and wind. Therefore, the back sheet can be applied to the solar cell module at the desert area of high temperature and can improve generator efficiency.

In order to solve problems of a conventional art such that the back sheet is easily damaged due to occurrence of crack and weight of the back sheet is heavy since the basic material of the reflective layer is glass, the back sheet according to the exemplary embodiments of the present invention is made of plastic film. Therefore, the back sheet may be easily manufactured, conveyed and mounted, and load applied to the solar cell module may be reduced due to light weight of the back sheet.

EXAMPLE 1

1) Manufacturing Aqueous Polyurethane Resin for Resin Coating Layer

The aqueous polyurethane resin in which weight ratio of polyester component to polyurethane component is about 25:75 is manufactured by using dimethylterephthalic acid and dimethylisophthalic acid as dicarboxylic acid component, ethylene glycol and diethylene glycol as glycol component, and 5-isocyanate-1-isocyanatemethyl-1,3,3-trimethyl cyclohexane as diisocyanate component, adding polyester component represented by Chemical Formula 1, and then copolymerized. Aqueous dispersion is manufactured by dispersing 1 wt % polyurethane resin (based on solid contents) and 0.05 wt % surfactant in water.

2) Manufacturing Polyester Film

Polyester resin is acquired by means of transesterification and polycondensation of dimethylterephthalate and ethylene glycol. After the polyester resin is melt-extruded, the polyester resin is elongated three to four times in one direction at 70 to 100° C. so as to manufacture the polyester film.

3) Manufacturing Reflective Film (Polyester Film Including Deposited Reflective Layer)

The aqueous dispersion manufactured in item 1) is coated on at least one surface of the polyester film manufactured in item 2) such that thickness of coated layer is 4 to 6 μm before drying. After that, the coated polyester film is elongated three to four times in the other direction at 220° C. to 240° C. and is dried so as to manufacture a transparent polyester film including a biaxial oriented aqueous dispersion resin coating layer.

Aluminum is deposited on the coated layer of the transparent polyester film including the aqueous dispersion resin coating layer so as to manufacture the polyester film including the deposited reflective layer on which the aluminum is deposited. The OD of the deposited reflective layer is 2.

4) Manufacturing Back Sheet

The UV blocking layer is formed at the polyester film including the deposited reflective layer manufactured in item 3) by coating the adhesive including the ultraviolet (UV) stabilizer on the deposited reflective layer such that the polyester film has 1% UV transmittance at 380 nm wavelength. After the polyester film is dried at 100° C., a transparent polyvinylidene fluoride (PVDF) film is laminated on the polyester film so as to form the protecting film. In order to melt-press the encapsulation on the opposite surface to the deposited reflective layer of the polyester film including the deposited reflective layer, the second adhesive layer is formed by laminating the transparent polyethylene film on the polyester film through the above-mentioned method. Thereby, the back sheet for solar cell module of Example 1 is manufactured.

EXAMPLE 2

The back sheet for the solar cell module of Example 2 is manufactured by the same method of manufacturing the back sheet of Example 1. However, the OD of the deposited reflective layer according to Example 2 is 3.

EXAMPLE 3

The back sheet for the solar cell module of Example 3 is manufactured by the same method of manufacturing the back sheet of Example 1. However, the OD of the deposited reflective layer according to Example 3 is 3.5.

EXAMPLE 4

The back sheet for the solar cell module of Example 4 is manufactured by the same method of manufacturing the back sheet of Example 1. However, aqueous polyurethane base resin which does not include polyestercomponent instead of polyurethane resin according to Example 1 is used in item 2) of Example 1.

EXAMPLE 5

The back sheet for the solar cell module of Example 5 is manufactured by the same method of manufacturing the back sheet of Example 1. However, WR-961 of Nippon Synthetic Chemical Industry as water-soluble polyester resin instead of polyurethane resin according to Example 1 is used in item 2) of Example 1.

EXAMPLE 6

The back sheet for the solar cell module of Example 6 is manufactured by the same method of manufacturing the back sheet of Example 1. However, the adhesive including the ultraviolet (UV) stabilizer has 3% UV transmittance at 380 nm wavelength.

EXAMPLE 7

The back sheet for the solar cell module of Example 7 is manufactured by the same method of manufacturing the back sheet of Example 1. However, the adhesive including the ultraviolet (UV) stabilizer has 5% UV transmittance at 380 nm wavelength.

EXAMPLE 8

The back sheet for the solar cell module of Example 8 is manufactured by the same method of manufacturing the back sheet of Example 1. However, the adhesive which does not include the ultraviolet (UV) stabilizer is used.

COMPARATIVE EXAMPLE 1

The back sheet for the solar cell module of Comparative Example 1 is manufactured by the same method of manufacturing the back sheet of Example 1. However, the OD of the deposited reflective layer according to Comparative Example 1 is 1.5.

COMPARATIVE EXAMPLE 2

The back sheet for the solar cell module of Comparative Example 2 is manufactured by the same method of manufacturing the back sheet of Example 1. However, the aqueous dispersion manufactured in item 1) of Example 1 is not coated on the polyester film.

COMPARATIVE EXAMPLE 3

The back sheet for the solar cell module of Comparative Example 3 is manufactured by the same method of manufacturing the back sheet of Example 1. However, AC-503 of Rohm and Haas Company as polyacryl base resin instead of polyurethane resin according to Example 1 is used in item 2) of Example 1.

EXPERIMENT 1

Test of Reflectivity and Water Vapor Permeability

The reflectivity of the back sheets according to Examples 1 to 3 and Comparative Example 1 or the reflectivity of the solar cell module including the same and the water vapor permeability of the back sheets according to Examples 1 to 3 and Comparative Example 1 are measured and shown in Table 1.

Test Method of Measuring Properties

1) Reflectivity: Average reflectivity at each spectral region in a range of 400-2500 nm wavelength light is measured by a spectrophotometer (V670, Jasco Corporation) at reflection mode.

2) Mini module: structure of glass/two sheets of encapsulation (Ethylene vinylacetate, EVA)/back sheet.

Samples are manufactured through vacuum-lamination at 150° C.

TABLE 1

| | Reflectivity (%) | | | water vapor permeability (g/m²day) back sheet (38, 90% RH) |
|---|---|---|---|---|
| | back sheet (only) | | mini module | |
| | visible ray region (400-780 nm) | near-infrared region (780-2500 nm) | power generating region (400-1150 nm) | |
| Example 1 | 76.2 | 64.9 | 70.7 | 0.6 |
| Example 2 | 75.2 | 64 | 70.3 | 0.62 |

TABLE 1-continued

|  | Reflectivity (%) | | | water vapor permeability (g/m²day) back sheet (38, 90% RH) |
|---|---|---|---|---|
|  | back sheet (only) | | mini module | |
|  | visible ray region (400-780 nm) | near-infrared region (780-2500 nm) | power generating region (400-1150 nm) | |
| Example 3 | 75.6 | 64.2 | 70.4 | 0.65 |
| Comparative Example 1 | 63.2 | 58.2 | 60.5 | 0.9 |

Referring to Table 1, Examples 1, 2 and 3 respectively having the OD of 2, 3 and 3.5 show excellent reflectivity, but Comparative Example 1 having the OD of 1.5 shows that reflectivity of the back sheet and the mini module is reduced. Therefore, if the reflective film according to Examples 1, 2 and 3 is used, the back sheet has excellent reflectivity. In addition, water vapor permeability according to Comparative Example 1 is inferior to water vapor permeability according to Examples 1 to 3.

EXPERIMENT 2

Test of Adherence to Base Material and Adherence Between Layers

In order to durability of the back sheets according to Example 1, Example 4, Example 5, Comparative Example 2 and Comparative Example 3 after testing with environmental testing guidelines IEC-61215 or IEC 61730 (Damp heat test, 85° C./85% RH/1,000 hr condition), adherence to base material and adherence between layers of the metal deposited layer are measured and shown in Table 2.

Test Method of Measuring Properties
1) Adherence to base material: ASTM D3359 (Cross cut tape adhesion test).
Adherence to base material is tested by means of lattices remaining after detachment of 100 ea lattices.
2) Adherence between layers: JIS K-6854 (Testing methods for Peel strength of Adhesive)
180 Peel test, detaching speed: 300 mm/min

TABLE 2

|  | Coating liquid | Test condition 85/85% RH | Adherence to base material 100/100 | Adherence between layers unit, N/cm |
|---|---|---|---|---|
| Example 1 | aqueous polyurethane resin | 1,000 hr | 100/100 | 4.1 |
| Example 4 | aqueous polyurethane resin not including polyester component | 1,000 hr | 85/100 | 2.2 |
| Example 5 | aqueous polyester resin | 1,000 hr | 54/100 | 1.6 |
| Comparative Example 2 | Not coated | 1,000 hr | 0/100 | 0.3 |
| Comparative Example 3 | aqueous acryl resin | 1,000 hr | 20/100 | 1.3 |

Referring to Table 2, the back sheet according to Example 1 using the aqueous polyurethane resin including the polyester component and the polyurethane component shows the most excellent adherence to base material and adherence between layers, and the back sheet according to Example 4 using the aqueous polyurethane resin which does not include the polyester component shows comparatively excellent adherence to base material and adherence between layers. The back sheet according to Example 5 using the aqueous polyester resin without the polyurethane component shows a certain level of adherence to base material and adherence between layers. However, the adherence to base material and the adherence between layers of the back sheet according to Example 5 is weaker than those according to Example 1 and Example 4.

The back sheet according to Comparative Example 2 in which the aluminum layer is directly coated on the polyester film without coating liquid shows very weak adherence to base material and adherence between layers. The back sheet according to Comparative Example 3 using the aqueous acryl resin shows a certain level of adherence between layers but weak adherence to base material.

EXPERIMENT 3

UV Resistance Test

Color change of the back sheets according to Example 1 and Examples 6 to 8 under UV resistance test condition (15 kWh/m2@UVA 280-385 nm, 60° C.) required by IEC-61215 or IEC 61730 condition is measured and shown in Table 3.

Test Method of Measuring Properties
1) Transmittance: Transmittance of 380 nm light is measured by UV Visible spectrophotometer (UltraScan™ Pro, HunterLab Inc.).
2) Yellowing: Yellowness Index (YI) is measured at E313 [D65/10] mode by a colorimeter (UltraScan™ Pro, HunterLab Inc.).

TABLE 3

| | Type of coating | Transmittance (@380 nm) | Yellowing (YI, 15 kwh/m2@UVA) |
|---|---|---|---|
| Example 1 | UV blocking adhesive | 1 | 1 |
| Example 6 | UV blocking adhesive | 3 | 2 |
| Example 7 | UV blocking adhesive | 5 | 15 |
| Example 8 | Adhesive without UV stabilizer | 70 | 36 |

Referring to Table 3, if the UV blocking layer is formed by coating the UV blocking adhesive, transmittance at 380 nm wavelength is very low. On the contrary, if the adhesive without UV stabilizer is used, a large amount of UV light is transmitted. In addition, YIs according to Examples 1 and 6 are very low but YIs according to Examples 7 and 8 are high.

In conclusion, if the resin coating layer and the deposited reflective layer according to exemplary embodiments of the present invention are used, stable adhesion properties may be obtained under high temperature and humidity environment. In addition, if the OD of the deposited reflective layer is 2 to 3, the reflectivity is 75-80% at visible ray region, 60-65% at infrared ray region, and 70% at the power generating region of the solar cell.

Therefore, generator performance of the solar cell module may be improved. In addition, the UV resistance is stable if the UV blocking adherence having 3% or lower transmittance at 380 nm wavelength is used.

The back sheet for the solar cell module including the metal deposited polyester film according to the exemplary embodiments of the present invention has advantages of enhancing durability and UV resistance under high temperature and humidity environment and increasing reflectivity and output of the solar cell.

In addition, the solar cell module manufactured by the method according to the exemplary embodiments of the present invention or the solar cell module according to exemplary embodiments of the present invention uses the back sheet having improved properties such as heat resistance, moisture resistance, UV resistance, dimensional stability, strength, elongation, workability, chemical resistance, reflectivity, etc. Therefore, durability and efficiency of the solar cell module may be improved and convenience of installing and managing the solar cell module may be increased.

Particularly, the solar cell module according to the exemplary embodiments of the present invention has long cycle-life and excellent photoelectric conversion efficiency under severe environment where the back sheet is exposed to strong ultraviolet rays and high temperature in long term, there is strong possibility of occurrence of crack due to sharp temperature change, the humidity is high, and there is strong possibility of being damaged by sand and wind.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A back sheet for a solar cell module comprising:
a reflective film comprising,
    an electric insulating base film layer made of a polyester film containing more than 60 wt % of ethyleneterephthalate as a repeating unit, wherein the polyester film is made by biaxially stretching a resin composition having limiting viscosity of 0.4 to 0.9 dl/g,
    a copolymerization resin coating layer having an aqueous urethane resin being formed by copolymerizing polyester components and polyurethane components, wherein weight ratio of the polyester components to the polyurethane components ranges 1:1 to 1:5, wherein the polyurethane components include dicarboxylic acid compound, glycol compound and diisocyanate compound,
    wherein one entire surface of the copolymerization resin coating layer is attached at one entire surface of the base film layer by coating 0.01 to 0.5 g/m$^2$ of the aqueous polyurethane resin, and
    a deposited reflective layer including metal and having 2 to 3.5 optical density (OD),
    wherein one surface of the deposit reflective layer is attached at the other entire surface of the copolymerization resin coating layer,
    wherein adhesion between the copolymerization resin coating layer and the base film layer and/or the deposited reflective layer is higher than or equal to 3N/cm under 85° C./85% RH and 1,000 hr operation condition,
wherein water vapor permeability of the back sheet is lower than or equal to 0.75 g/m$^2$ day under 38° C. and 90% relative humidity condition.

2. The back sheet of claim 1, further comprising an UV blocking layer positioned on a part or all of one surface or both surfaces of the reflective film and having 5% or lower transmittance of light at 380 nm wavelength.

3. The back sheet of claim 2, further comprising a protecting film positioned on the UV blocking layer formed at one surface of the reflective film and a first adhesive layer contacting with the reflective film.

4. The back sheet of claim 3, wherein thermal conductivity of the back sheet is 0. 2 to 0.3 W/mK (70° C.).

5. The back sheet of claim 1,
wherein the glycol compound includes more than two types of compound selected from the group consisting of ethylene glycol, 1,2-propanediol, 1,3-propanediol, 1,4-butanediol, neopentyl glycol, 1,6-hexanediol, 1,2-cyclohexane dimethanol, 1,3-cyclohexane dimethanol, 1,4-cyclohexane dimethanol, p-xylene glycol, diethylene glycol, triethylene glycol, polyether glycol, polyethylene glycol and polytetramethylene glycol.

6. The back sheet of claim 1, wherein reflectivity of the back sheet is 75 to 80% at visible ray region (400-780 nm) and 60 to 65% at near-infrared region (780-2500 nm).

* * * * *